United States Patent
Xu et al.

(10) Patent No.: US 6,908,825 B2
(45) Date of Patent: Jun. 21, 2005

(54) METHOD OF MAKING AN INTEGRATED CIRCUIT INDUCTOR WHEREIN A PLURALITY OF APERTURES ARE FORMED BENEATH AN INDUCTIVE LOOP

(75) Inventors: Shuming Xu, Santa Clara, CA (US); Hanhua Feng, Singapore (SG); Pang Dow Foo, Singapore (SG); Bai Xu, Albany, NY (US); Uppili Sridhar, Singapore (SG)

(73) Assignee: Institute of Microelectronics, Singapore Science Park (SG)

( * ) Notice: Subject to any disclaimer, the term of this patent is extended or adjusted under 35 U.S.C. 154(b) by 0 days.

(21) Appl. No.: 10/298,418

(22) Filed: Nov. 14, 2002

(65) Prior Publication Data

US 2003/0071325 A1 Apr. 17, 2003

Related U.S. Application Data

(62) Division of application No. 09/737,439, filed on Dec. 13, 2000, now Pat. No. 6,495,903.

(30) Foreign Application Priority Data

May 25, 2000 (SG) ..................................... 200002874-6

(51) Int. Cl.[7] .............................................. H01L 21/764
(52) U.S. Cl. .................... 438/381; 438/411; 438/422
(58) Field of Search ................................ 438/171, 190, 438/210, 238, 329, 381–399, 411; 257/528–543; 428/422; 264/61

(56) References Cited

U.S. PATENT DOCUMENTS

| | | | |
|---|---|---|---|
| 5,539,241 A | * | 7/1996 | Abidi et al. ................. 257/531 |
| 5,742,091 A | | 4/1998 | Hebert |
| 5,831,331 A | | 11/1998 | Lee |
| 6,153,489 A | | 11/2000 | Park et al. |
| 6,169,320 B1 | * | 1/2001 | Stacey ........................ 257/531 |
| 6,180,433 B1 | | 1/2001 | Furey et al. |
| 6,211,056 B1 | * | 4/2001 | Begley et al. .............. 438/619 |
| 6,221,727 B1 | | 4/2001 | Chan et al. |
| 6,242,791 B1 | | 6/2001 | Jou |
| 6,274,920 B1 | | 8/2001 | Park et al. |
| 6,287,931 B1 | | 9/2001 | Chen |

FOREIGN PATENT DOCUMENTS

| | | |
|---|---|---|
| JP | 05082736 A | 4/1993 |
| WO | WO 97/45873 | 12/1997 |

OTHER PUBLICATIONS

Hutte, des Ingenieurs Taschenbuch 28 ed., vol. IV A, p. 446 Wilhem Ernst & Sohn, Berlin (DE) 1957.

* cited by examiner

Primary Examiner—Howard Weiss
Assistant Examiner—Marcos D. Pizarro-Crespo
(74) Attorney, Agent, or Firm—Knobbe Martens Olson & Bear LLP

(57) ABSTRACT

The invention relates to a method of making an integrated circuit inductor that comprises a silicon substrate and an oxide layer on the silicon substrate. In one aspect, the method comprises depositing an inductive loop on the oxide layer, and making a plurality of apertures in the oxide layer beneath the inductive loop. The method also comprises providing a plurality of bridges adjacent the apertures and provided by portions of the oxide layer between an inner region within the inductive loop and an outer region of the oxide layer without the inductive loop, the inductive loop being supported on the bridges. The method comprises forming a trench in the silicon substrate beneath the bridges, to provide an air gap between the inductive loop and the silicon substrate.

7 Claims, 5 Drawing Sheets

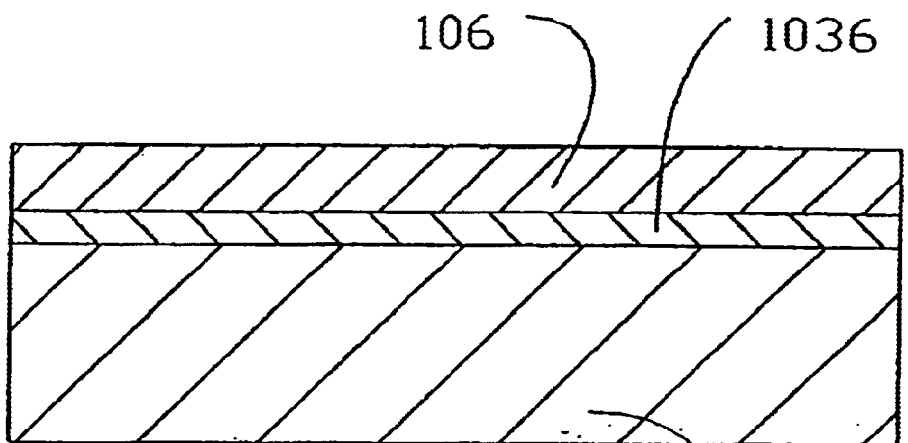
FIGURE 5(i)
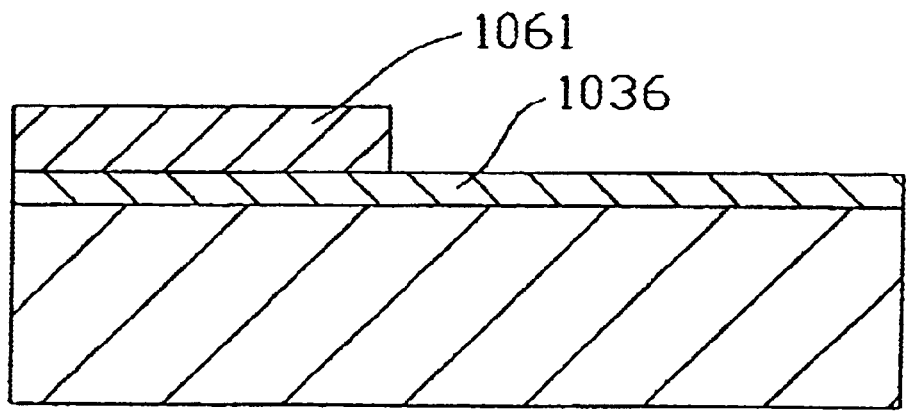
FIGURE 5(ii)
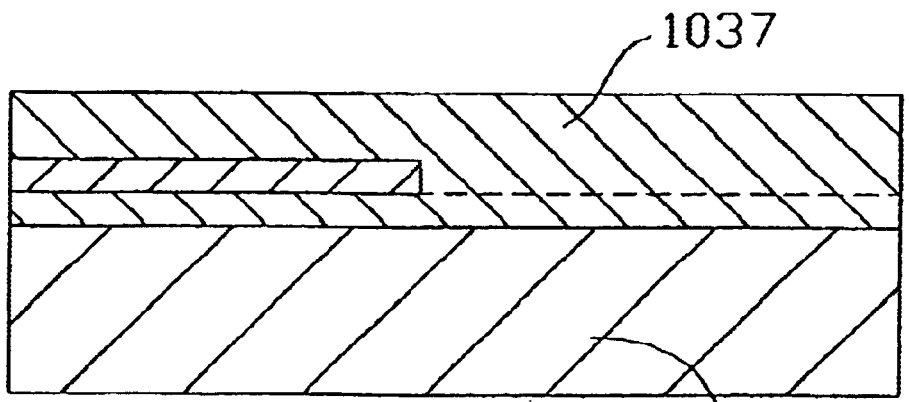
FIGURE 5 (iii)

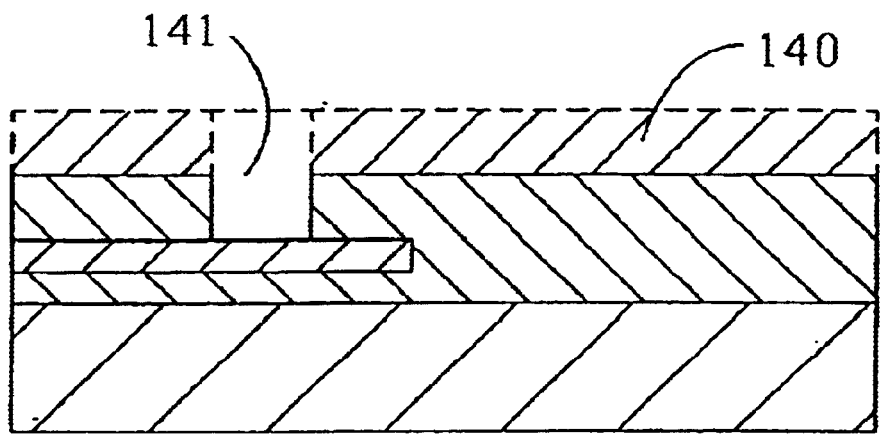
FIGURE 5(iv)
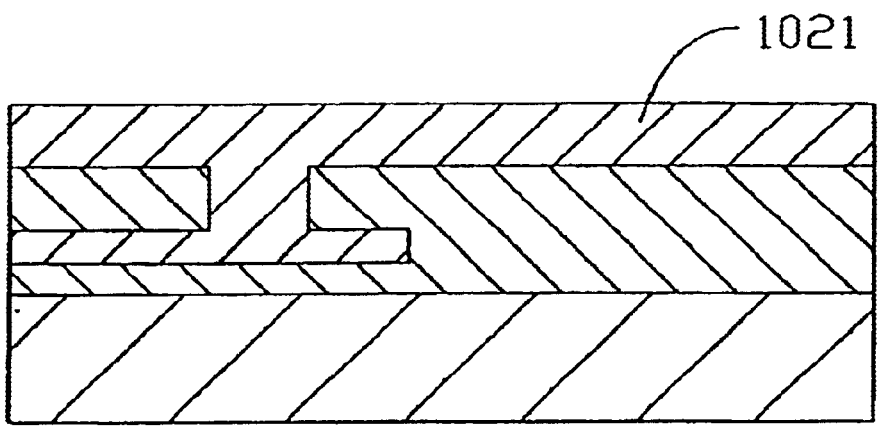
FIGURE 5(v)
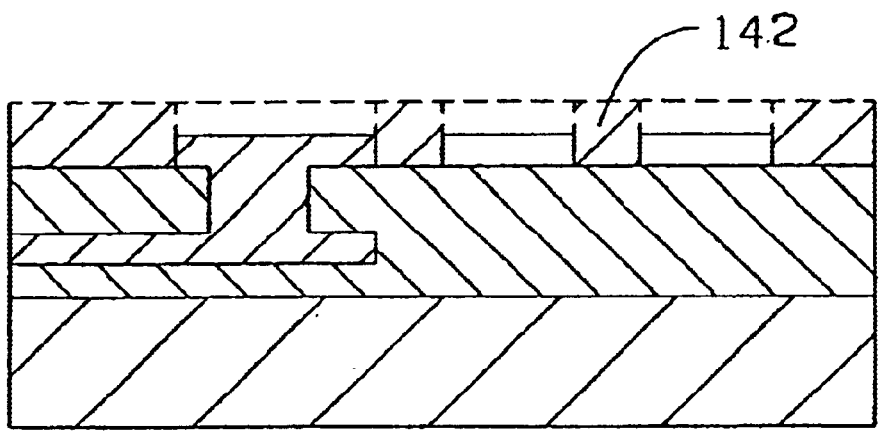
FIGURE 5 (vi)

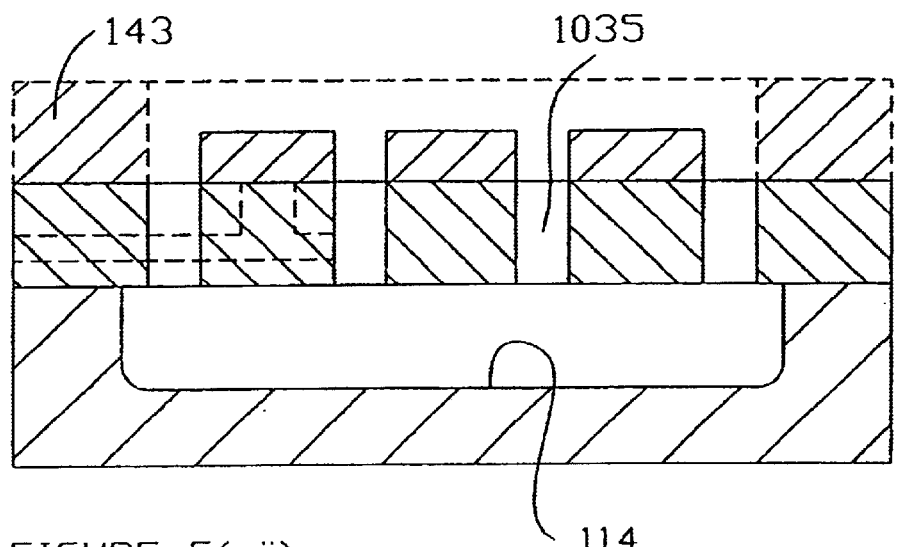
FIGURE 5(vii)

METHOD OF MAKING AN INTEGRATED CIRCUIT INDUCTOR WHEREIN A PLURALITY OF APERTURES ARE FORMED BENEATH AN INDUCTIVE LOOP

RELATED APPLICATIONS

This application is a divisional application, and claims priority under 35 U.S.C. §121 from U.S. patent application Ser. No. 09/737,439, filed Dec. 13, 2000, now U.S. Pat. No. 6,495,903, and which is incorporated by reference.

BACKGROUND OF THE INVENTION

1. Field of the Invention

The present invention relates to a method of making an integrated circuit inductor.

2. Description of the Related Technology

An integrated circuit inductor is an inductive component built up on a substrate in a similar manner to other components, and generally includes a spiral conductive trace. This arrangement has the disadvantage of high parasitic loss, in the form of resistive and capacitive loss to the semiconductor substrate on which the integrated circuit is built.

A solution to this problem is to selectively etch the silicon substrate beneath the conductive trace, as described in U.S. Pat. No. 5,539,241. This solution is shown in the accompanying drawings.

FIG. 1 is a plan view of an integrated circuit inductor 1 according to the prior art. FIG. 2 is a cross-sectional view of the inductor 1 on the line II—II in FIG. 1.

Referring to the figures, the inductor 1 comprises a spiral aluminum track 2 is laid down on an insulating oxide layer 3, which itself covers a semiconductor substrate 4. An underpass track 6 at a lower level in deposited layers making up the inductor 1 stretches from an inner end 5 to a connection 7. An outer end 8 is directly connected to another connection 9 at the same level. The spiral track 2 has a substantial extent. If the spiral track 2 is spaced from the semiconductor substrate 4 by a thickness of the insulating layer 3 alone, which has a comparatively high dielectric constant, the inductive track 2 has an appreciable distributed capacitance to the substrate 4. Hence, at high frequencies, the track 2 is liable to lose its inductive effect and acts as a capacitor.

In accordance with the improvement of U.S. Pat. No. 5,539,241, the oxide layer 3 has apertures 10 formed in it, with a track supporting portion 11 connected to the surrounding layer by bridges 12. Via the apertures 10, part of the substrate 4 is etched away, leaving an air gap 14 beneath the oxide portion 11. Thus, the inductive track 2 is widely spaced from the substrate 4, reducing the distributed capacitance thereto since air has a low dielectric constant.

Whilst this is a distinct improvement, the formation of the air gap 14 requires the use of aggressive chemicals and is made by a slow process. Further, the air gap 14 can be formed only in a post-fabrication step, because a liquid etchant required is not used in a CMOS fabrication. Accordingly, there is a need for an improved integrated circuit inductor and a method of producing thereof.

SUMMARY OF CERTAIN INVENTIVE ASPECTS

One aspect of the invention provides a method of making an integrated circuit inductor that has a silicon substrate and an oxide layer on the silicon substrate. The method comprises depositing an inductive loop on the oxide layer, and opening a plurality of apertures in the oxide layer beneath the inductive loop. The method also comprises providing a plurality of bridges to support the inductive loop and forming a trench in the silicon substrate beneath the bridges. In this aspect of the invention, the trench is formed by etching of the silicon substrate. The etching is continued until the trench is continuous beneath the extent of the inductive loop. The bridges are adjacent the apertures and provided by portions of the oxide layer between an inner region within the inductive loop and an outer region of the oxide layer without the inductive loop.

Another aspect of the invention provides a method of making an integrated circuit inductor that has a silicon substrate and an oxide layer on the silicon substrate. The method comprises depositing an inductive loop on the oxide layer, and making a plurality of apertures in the oxide layer beneath the inductive loop. The method also comprises providing a plurality of bridges adjacent the apertures and provided by portions of the oxide layer formed between an inner region within the inductive loop and an outer region of the oxide layer without the inductive loop, the inductive loop being supported on the bridges. The method comprises forming a trench in the silicon substrate beneath the bridges, to provide an air gap between the inductive loop and the silicon substrate. In this aspect of the invention, the apertures and the bridges extend generally radially from the inner region. The trench extends circumferentially around the inner region. The inductive loop has a plurality of spirally arranged turns. The oxide layer includes an underpass connection in one of the bridges from a peripheral connection to another end of the inductor to its inner end.

Still another aspect of the invention provides a method of making an integrated circuit inductor that has a silicon substrate and an oxide layer on the silicon substrate. The method comprises depositing an inductive loop on the oxide layer, and defining a plurality of apertures in the oxide layer beneath the inductive loop, each aperture forming an underpass to a plurality of segments of the inductive loop. The method also comprises providing a plurality of bridges to support the inductive loop and forming a trench in the silicon substrate beneath the bridges, to provide an air gap between the inductive loop and the silicon substrate. In this aspect of the invention, the bridges are adjacent the apertures and provided by portions of the oxide layer formed between an inner region within the inductive loop and an outer region of the oxide layer without the inductive loop.

Yet another aspect of the invention provides a method of making an integrated circuit inductor that has a silicon substrate and an oxide layer on the silicon substrate. The method comprises depositing an inductive loop on the oxide layer. The method also comprises opening a plurality of apertures in the oxide layer beneath the inductive loop so as to provide a plurality of bridges to support the inductive loop. The method comprises forming a trench in the silicon substrate beneath the bridges.

BRIEF DESCRIPTION OF THE DRAWINGS

To help understand the invention, a specific embodiment thereof will now be described with reference to the accompanying drawings, in which:

FIGS. 5(i) to 5(vii) illustrate a series of steps in the production of FIG. 3.

DETAILED DESCRIPTION OF CERTAIN INVENTIVE EMBODIMENTS

Figure 1:
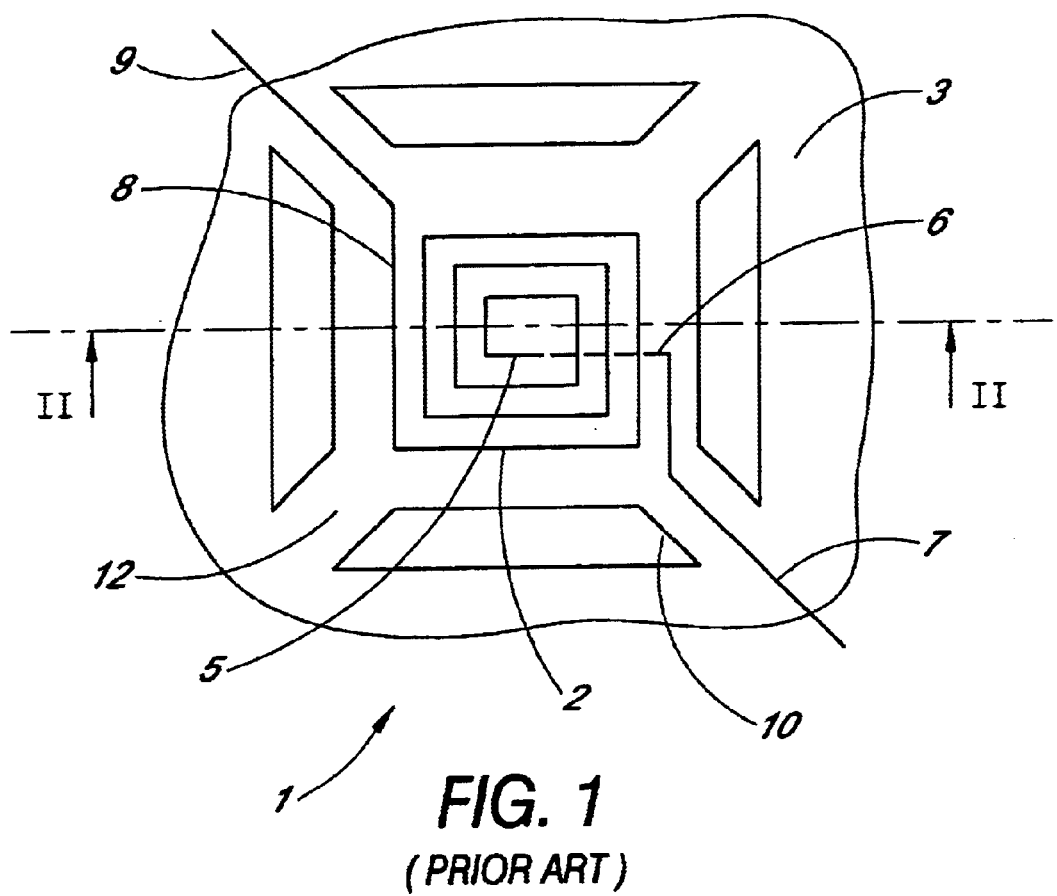
FIG. 1 is a plan view of an integrated circuit inductor in the prior art.
Figure 2:
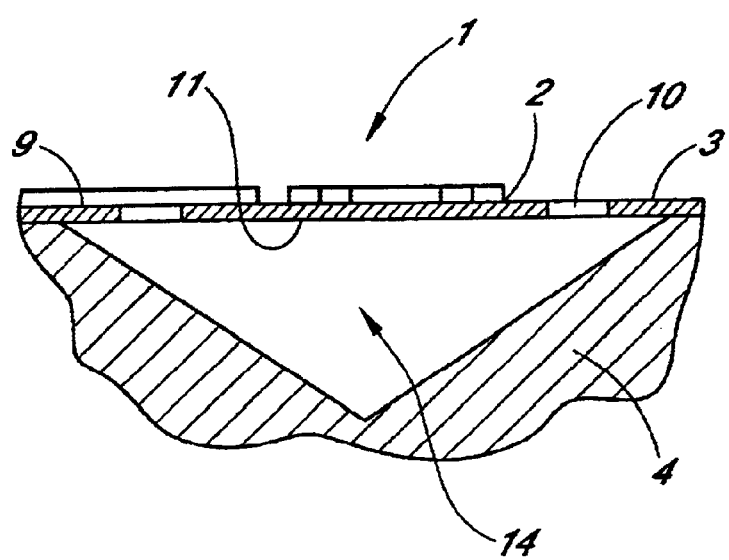
FIG. 2 is a cross-sectional view of the inductor on the line II—II in FIG. 1.
Figure 3:
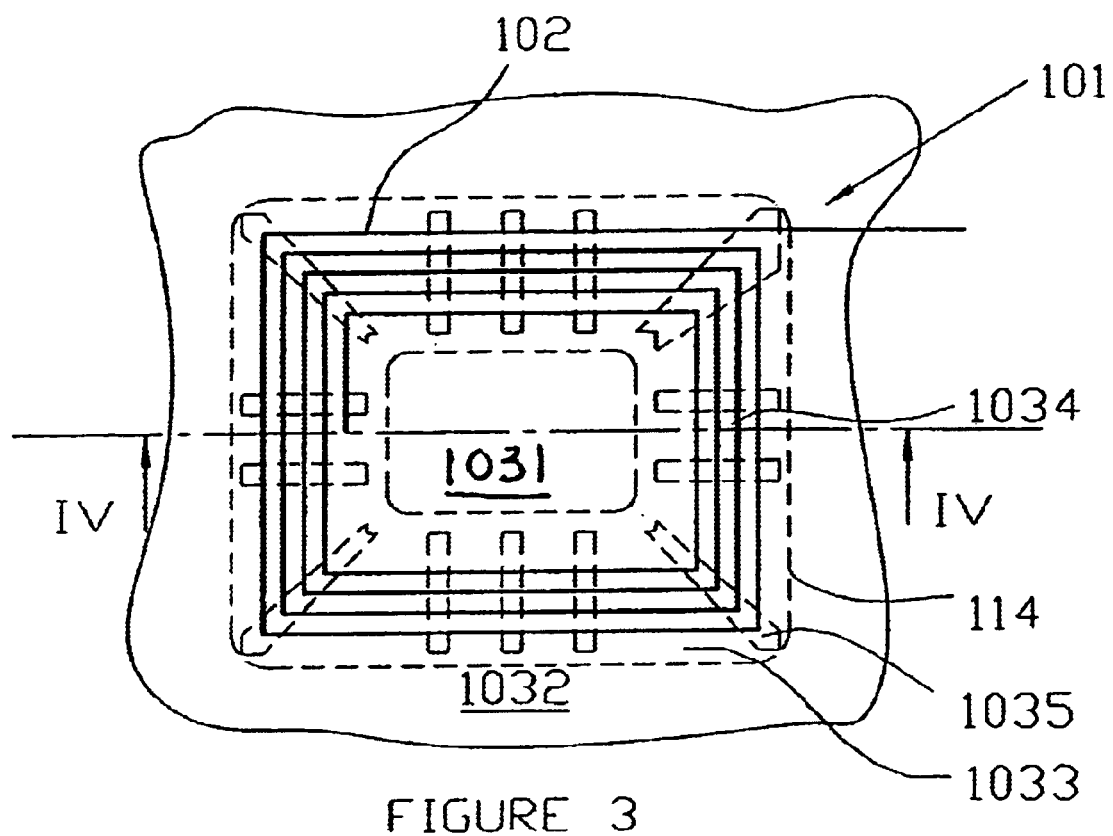
FIG. 3 is a plan view of an integrated circuit inductor according to one embodiment of the invention.
Figure 4:
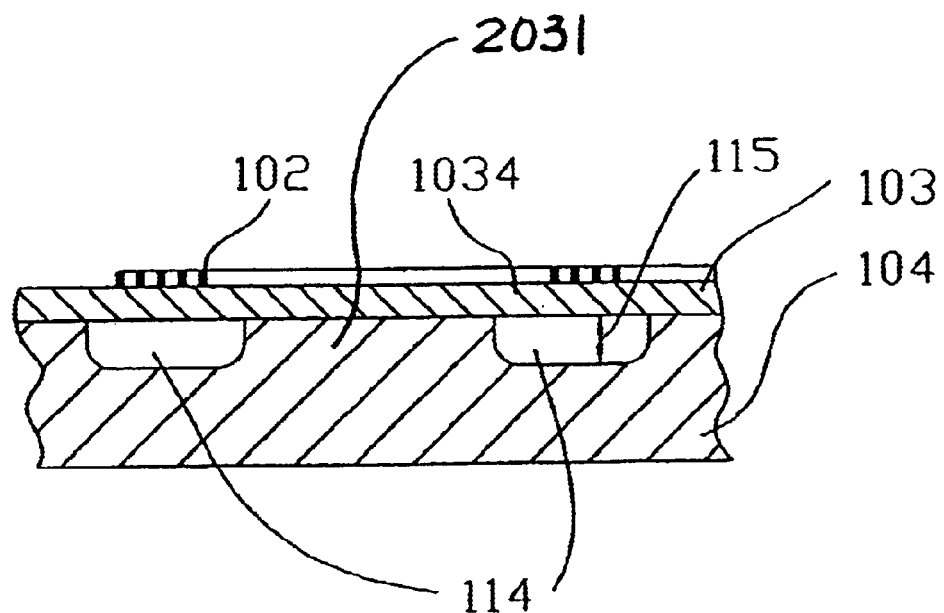
FIG. 4 is a cross-sectional view of the inductor on the line IV—IV in FIG. 3.

FIG. 3 is a plan view of an integrated circuit inductor 101 according to one embodiment of the invention. FIG. 4 is a cross-sectional view of the inductor 101 on the line IV—IV in FIG. 3.

Referring to FIGS. 3 and 4, the inductor 101 of the invention has a spiral aluminum track 102. The track 102 is deposited on an oxide layer 103 over a silicon substrate 104. The substrate 104 is etched away to form a trench 114, which extends around beneath the track 102, and provides an air gap 115 having a low dielectric constant.

The oxide layer 103 has an inner region 1031 within the track 102, an outer region 1032 outside the track 102, and a bridging region 1033 extending between the other regions. The bridging region 1033 is comprised of intact bridges 1034 and apertures 1035 therebetween, which are open to the trench 114 and through which an etchant has access to the silicon substrate 104 to form the trench 114 by etching. Reference numeral 2031 indicates a substrate pillar supporting the inner region 1031 of the oxide layer 103.

FIGS. 5(i) to 5(vii) illustrate a series of steps in the production of the inductor 101 of FIG. 3. Referring now to FIGS. 5(i) to 5(vii), a first oxide layer 1036 is first laid down on the silicon substrate 104, with a first metal layer 106 on the top. As shown in FIG. 5(ii), the metal layer 106 is etched back to leave only a short track 1061, which will form an "underpass" connection to the inner end of the spiral track 102 of the inductor 101.

An additional oxide layer 1037, as shown in FIG. 5(iii), is deposited over the top of the bottom layer 1036 to at least temporarily enclose the bottom layer 1036. Then, via a temporary mask 140, as shown in FIG. 5(iv), vias 141 are etched to the underpass track 1061. With the mask removed again, as shown in FIG. 5(v), a further metal 1021 is deposited to fill the vias 141 and provide metal for the spiral track 102. For the definition of this, as shown in FIG. 5(vi), another mask 142 is laid down, and the metal between the tracks 102 is removed. The mask 142 is removed. At this stage, the metal of the track 102 is fully defined.

Now as shown in FIG. 5(vii), a further mask 143 is laid down, to etch away gaps 1035 in the oxide, that is, in both the first and second layers 1036, 1037, down to the silicon substrate 104. The bridges 1034 from the central region 1031 to the circumferential regions 1032 are left intact, with the conductive track 102 spanning from one bridge to the next. Finally, the silicon substrate 104 beneath the gaps 1035 is etched away. The etching is continued until the voids formed beneath the track 102 coalesce to form the trench 114.

Figure 6:
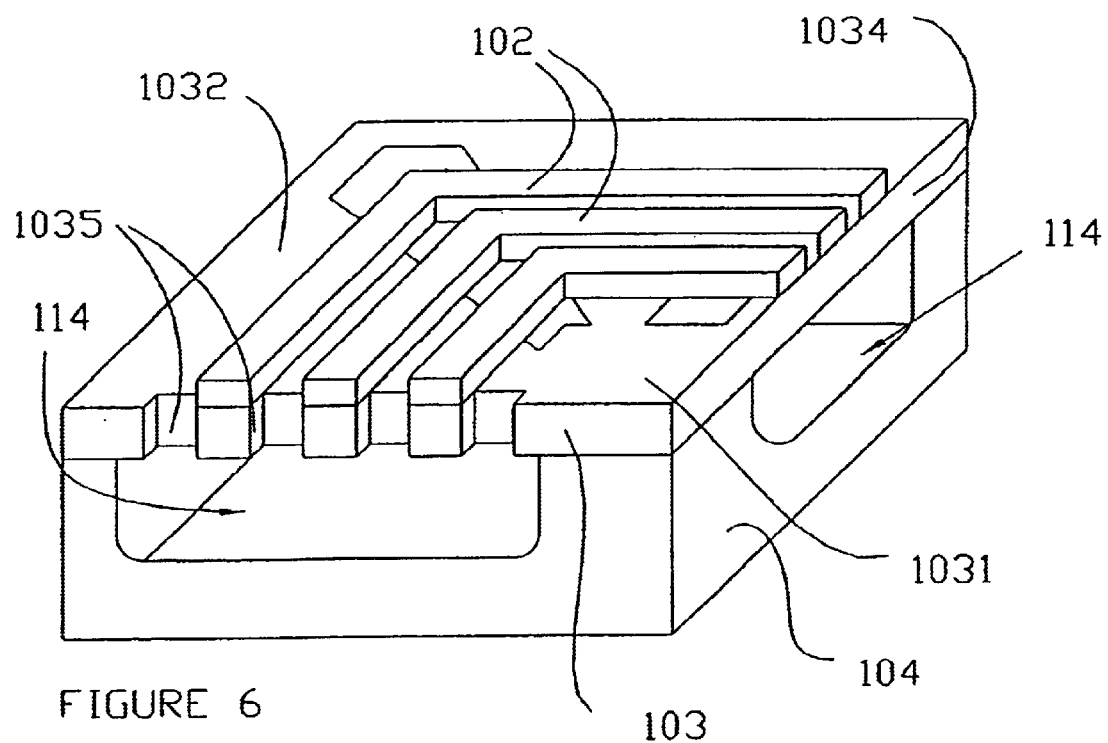
FIG. 6 is a perspective view of a corner portion of the inductor of FIG. 3.

FIG. 6 shows a perspective view of the trench 114 under a corner portion of the inductor 101. Since the etching of the substrate 104 is carried out from directly above the place where the trench 114 is to be formed, as opposed to being carried out from outside the inductor as in the prior art referred above, no extra area is consumed. Further, the etching is fully CMOS compatible in the use of CMOS RIE tools and gases such as $SF_6$, He, $O_2$, etc.

As can be seen from FIGS. 3, 4, and 6, the integrated inductor 101 of one embodiment of the invention is only partially separated from the substrate 104. That is, the inner region 1031, which has no inductive loops, is positioned on the substrate 104 with no spacing. The integrated inductor 101 is, in fact, "bridging" across the trench 114, with only inductive loop 102 positioned over the substrate 104.

The material details of the above steps are the same as those employed in CMOS technology, and as such are familiar to those skilled in the art, will not be described in more detail. Some of the described steps will be useful in the formation of other components elsewhere on the substrate; and indeed other steps may be incorporated in the process for forming components elsewhere without interfering with the formation of the inductor.

Utilizing the invention, an inductor is achieved that has a low parasitic capacitance and a Q value of 15 at 1.9 GHz.

The integrated inductor of one embodiment of the invention produces the following advantages. First, the manufacturing process of the integrated inductor is compatible with that of CMOS. Second, the integrated inductor is mechanically more stable because of the "pillar" support. Third, the substrate is less consumed; therefore the structure is etchant and material-saving, and the manufacturing process is more efficient.

What is claimed is:

1. A method of making an integrated circuit inductor, the integrated circuit having a silicon substrate and an oxide layer on the silicon substrate, the method comprising:

depositing an inductive loop on the oxide layer;

making a plurality of apertures in the oxide layer beneath the inductive loop;

providing a plurality of bridges adjacent the apertures and provided by portions of the oxide layer formed between an inner region within the inductive loop and an outer region of the oxide layer without the inductive loop, the inductive loop being supported on the bridges; and forming a trench in the silicon substrate beneath the bridges, to provide an air gap between the inductive loop and the silicon substrate.

2. The method of claim 1, wherein the apertures and the bridges extend generally radially from the inner region.

3. The method of claim 1, wherein the trench extends circumferentially around the inner region.

4. The method of claim 1, wherein the inductive loop has a plurality of spirally arranged turns.

5. The method of claim 1, wherein the oxide layer includes an underpass connection in one of the bridges from a peripheral connection to another end of the inductor to its inner end.

6. A method of making an integrated circuit inductor, the integrated circuit having a silicon substrate and an oxide layer on the silicon substrate, the method comprising:

depositing an inductive loop on the oxide layer;

defining a plurality of apertures in the oxide layer beneath the inductive loop, each aperture forming an underpass to a plurality of segments of the inductive loop;

providing a plurality of bridges to support the inductive loop; and forming a trench in the silicon substrate beneath the bridges, to provide an air gap between the inductive loop and the silicon substrate.

7. The method of claim 6, wherein the bridges are adjacent the apertures and provided by portions of the oxide layer formed between an inner region within the inductive loop and an outer region of the oxide layer without the inductive loop.

* * * * *

UNITED STATES PATENT AND TRADEMARK OFFICE
CERTIFICATE OF CORRECTION

PATENT NO. : 6,908,825 B2
DATED : June 21, 2005
INVENTOR(S) : Xu et al.

It is certified that error appears in the above-identified patent and that said Letters Patent is hereby corrected as shown below:

<u>Title page,</u>
Item [73], Assignee, after "Park", insert -- II --.

Signed and Sealed this

Twenty-fifth Day of April, 2006

JON W. DUDAS
*Director of the United States Patent and Trademark Office*